US005472904A

United States Patent [19]
Figura et al.

[11] Patent Number: 5,472,904
[45] Date of Patent: * Dec. 5, 1995

[54] THERMAL TRENCH ISOLATION

[75] Inventors: Thomas A. Figura; Nanseng Jeng, both of Boise, Id.

[73] Assignee: Micron Technology, Inc., Boise, Id.

[*] Notice: The portion of the term of this patent subsequent to Aug. 1, 2012, has been disclaimed.

[21] Appl. No.: 287,384

[22] Filed: Aug. 8, 1994

Related U.S. Application Data

[63] Continuation-in-part of Ser. No. 205,663, Mar. 2, 1994.

[51] Int. Cl.$^6$ ................................................ H01L 21/76
[52] U.S. Cl. ........................ 437/67; 437/69; 437/72; 148/DIG. 50
[58] Field of Search ............................ 437/67, 69, 72; 148/DIG. 50

[56] References Cited

U.S. PATENT DOCUMENTS

| | | | |
|---|---|---|---|
| 4,541,167 | 9/1985 | Havemann | 576/29 |
| 4,868,136 | 9/1989 | Ravaglia | 437/38 |
| 4,892,614 | 1/1990 | Chapman et al. | 437/67 |
| 4,980,311 | 12/1990 | Namose | 437/72 |
| 5,087,586 | 2/1992 | Chan et al. | 437/72 |
| 5,130,268 | 7/1992 | Liou et al. | 437/67 |
| 5,342,480 | 8/1994 | Nishizawa et al. | 437/67 |
| 5,382,541 | 1/1995 | Bajor et al. | 437/67 |

FOREIGN PATENT DOCUMENTS

| | | | |
|---|---|---|---|
| 59-11645 | 1/1984 | Japan | 437/72 |
| 22342 | 2/1984 | Japan | 437/70 |
| 0121737 | 6/1985 | Japan | 437/67 |
| 61-81649 | 4/1986 | Japan | 437/69 |
| 0228650 | 10/1986 | Japan | 437/72 |
| 0256649 | 11/1986 | Japan | 437/67 |
| 63-87741 | 4/1988 | Japan | 437/69 |
| 63-137457 | 6/1988 | Japan | 437/70 |
| 63-155747 | 6/1988 | Japan | 437/70 |
| 2-26039 | 10/1990 | Japan | 437/70 |
| 0034556 | 2/1991 | Japan | 437/67 |
| 0218049 | 9/1991 | Japan | 437/67 |
| 513566 | 1/1993 | Japan | 437/72 |

OTHER PUBLICATIONS

Park et al., "A Novel LOCOS-Type Isolation Technology Free of the Field Oxide Thinning Effect", Extended Abstracts of the 1993 International Conference on Solid State Devices and Materials, Makuhari, 1993, pp. 528–530.
IBM Technical Disclosure Bulletin, vol. 29, No. 2, Jul. 1986.
Ghandhi, "VLSI Fabrication Principles", 1983, pp. 479–482 and pp. 495–497.
Toshiyuki Nishihara et al., "A 0.5 μm Isolation Technology Using Advanced Poly Silicon Pad LOCOS (APPL)", *IEEE*, 1988, pp. 100–103.
H. S. Yang et al., "Poly Void Formation in Poly Buffer LOCOS Process", Extended Abstracts of the Spring Electrochemical Society meeting, 1992, p. 442.
J. M. Sung, "The Impact of Poly-Removal Techniques on Thin Thermal Oxide Property in Poly-Buffer LOCOS Technology" *IEEE Transactions on Electron Devices*, Aug. 1991, pp. 1970–1973.
Stanley Wolf, "A Review of IC Isolation Technologies— Part 6", *Solid State Technology*, Dec. 1992, pp. 39–41.
R. L. Guldi, "Characterization of Poly-Buffered LOCOS in Manufacturing Environment", *J. Electrochem. Soc.*, Dec. 1989, pp. 3815–3820.

(List continued on next page.)

*Primary Examiner*—Brian E. Hearn
*Assistant Examiner*—Trung Dang
*Attorney, Agent, or Firm*—Kevin D. Martin

[57] ABSTRACT

A process useful for isolating active areas of semiconductor devices in which an isolation trench is created in a substrate, the isolation trench being lined with an oxidation barrier and filled with a thick film. An oxidation step is performed in which the thick film is oxidized. The oxidation is self-limiting as the oxidation barrier prevents the substrate surrounding the trench from being oxidized.

24 Claims, 3 Drawing Sheets

OTHER PUBLICATIONS

Tin–hwang Lin, "Twin–White–Ribbon Effect and Pit Formation Mechanism in PBLOCOS", *J. Electrochem. Soc.*, Jul. 1991, pp. 2145–2149.

M. Ghezzo, "LOPOS: Advanced Device Isolation for a 0.8 μm CMOS/BULK Process Technology", *Journal of The Electrochemical Society*, Jul. 1989, pp. 1992–1996.

N. Shimizu et al., "A Poly–Buffer Recessed LOCOS Process for 256 Mbit DRAM Cells", *IEEE*, IEDM 92–279, pp. 10.6.1–10.6.4.

THERMAL TRENCH ISOLATION

This invention was made with Government support under Contract No. MDA972-93-C-0033 awarded by Advanced Research Projects Agency (ARPA). The Government has certain rights in this invention. This is a continuation-in-part of application Ser. No. 08/205,663, filed on Mar. 2, 1994.

FIELD OF THE INVENTION

This invention relates to semiconductor manufacturing, and more particularly to isolation schemes for integrated circuits.

BACKGROUND OF THE INVENTION

As device dimensions decrease in size, and device density increases, it becomes more and more difficult to build an efficient and reliable isolation process to separate active devices. The limits of the standard LOCOS (LOCal Oxidation of Silicon) process have motivated the search for new isolation schemes.

The conventional, non-recessed, LOCOS-type process will not be adequate much below 0.9 µm active area-field pitch. This is the pitch which is suitable for the 16M DRAM, but is not suitable for the 64M DRAM generation.

Isolation for 256 Mb and greater density DRAMS, and 64 Mb and greater density SRAMS can not use standard LOCOS for isolation. Some of the problems with current isolation schemes are physical encroachment size, field oxide thinning effect, poor electrical isolation, and processes which are complicated and expensive.

One new isolation scheme is Poly Buffered LOCOS (PBL), which employs a thin polysilicon layer between the oxide and nitride films in the LOCOS stack.

PBL facilitates design rule shrinking and smaller cell size required for submicron and sub-half-micron device fabrication. This isolation scheme utilizes an oxide/poly/nitride sandwich to block oxidation of the active regions during field oxidation growth. The presence of the intermediate poly layer allows the oxide to be thinned and the nitride thickened without generating undue stress in the active regions in order to reduce encroachment during the field oxidation step.

One PBL method is referred to as ONO PBL because an oxide/nitride/oxide sandwich is used between the substrate and the polysilicon layer. See for example, U.S. Pat. No. 5,358,892, issued Oct. 25, 1994, entitled, "An Etch Stop Useful in Avoiding Substrate Pitting with Poly Buffered LOCOS," also assigned to Micron.

Another isolation scheme is known as recessed Poly Buffered LOCOS. See for example, Shimizu, et al. "A PolyBuffer Recessed LOCOS Process for 256 Mbit DRAM Cells."

Generally, recessed PBL processes lead to two main problems. The first one is the formation of a sharp corner at the active area field edge which leads to a higher leakage under positive bias on the gate. The second problem is the formation of a groove or indentation in the shape of a ring around the active areas. This groove can later lead to the generation of a stringer around the active area after etching, thereby causing a short. For a solution to this problem see, U.S. Pat. No. 5,393,694, entitled, "Advanced Process for Recessed Poly Buffered LOCOS," also assigned to Micron.

SUMMARY OF THE INVENTION

The present invention provides a method by which good isolation is obtained by using a nitride oxidation stop layer, and an amorphous silicon, polysilicon, CVD oxide, or silicon-rich deposited oxide for silicon dioxide formation.

The process of the present invention uses uncomplicated and controllable processing steps to obtain advantages from the traditional LOCOS and trench isolation. For example, there is a severe oxide thinning effect that limits the standard LOCOS process (among other difficulties) from being scaled below 0.5 µm. Trench isolation processes employ CMP technology that address the scaling issue, but add process complexity and thereby increase cost.

The process of the present invention utilizes batch type processes to generate "trench-like" structures in tight areas for superior isolation while maintaining the LOCOS-style isolation on the wide open field regions.

For purposes of this application: tight or narrow isolation areas refer to areas having a width less than 0.5 µm; and wide or open regions refer to regions which have a width greater than 0.5 µm. In actual practice, the wide regions have a width which is usually much greater than 0.5 µm.

The process of the present invention offers solutions to the above-stated problems relating to recessed PBL. One embodiment of the present invention provides a method for forming an isolation device in which several layers are formed on the surface of a semiconductor substrate. The layers and the substrate are then patterned and etched to a level below the surface of the substrate, thereby forming a trench-like structure or recess. A thin oxide layer is then grown or deposited, and a nitride layer is disposed thereon. A conformal film is then deposited, thereby blanketing the structure and filling the trench. The conformal film is etched back, and a field oxide region is grown on the exposed surface of the substrate, and remaining conformal film in the narrow field regions. The pad oxide and first nitride layer are then removed.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

The process of the present invention is discussed with reference to the LOCOS process. However, one having ordinary skill in the art, upon being apprised of the process of the present invention, would be able to adapt it to other LOCOS-type isolation schemes without undue experimentation.

Figure 1:
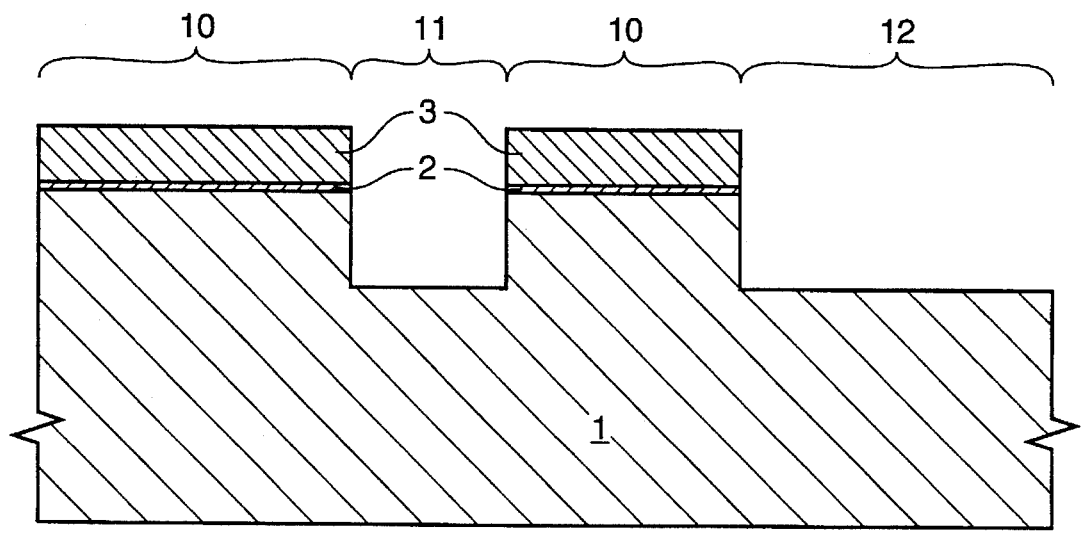
FIG. 1 is a schematic cross-section of the recessed trench formed according to the process of the present invention.

At the time in processing when the isolation stack 10 is ready to be formed, a layer of pad oxide 2 is preferably grown on a substrate 1, as shown in FIG. 1. In the LOCOS process, the semiconductor substrate 1, preferably bare silicon (Si) is used to produce a pad oxide 2. The pad oxide thickness, under normal conditions ranges from 100–500 Å.

The oxide layer 2 can be deposited or thermally grown. Stress-relief is one purpose served by the pad oxide layer 2. Alternatively, one may choose to employ an oxide layer having a thickness less than 100 Å, for example in the approximate range of 80 Å.

An insulative layer 3, preferably a thin layer of nitride, is then deposited, preferably by low pressure chemical vapor deposition (LPCVD), at approximately 800° C. to create the layer 3 having a preferred thickness in the approximate range of 1000 Å–3000 Å.

Nitride is the preferred material. However, other suitable materials, including but not limited to tantalum pentoxide, indium tin oxide, and high temperature metals, may also be used. Nitride is preferred because nitride is a "barrier" to oxidation.

In an alternative embodiment, the impervious layer 3 is disposed directly on the substrate 1, without the oxide layer 2 therebetween. However, an underlying oxide layer 2 is preferred as it affords some protection to the substrate 1.

A photomask and dry etch are then used to remove the stack 10 on the portions of the substrate 1 where the field oxide is to be grown. The isolation stack 10 is patterned with photoresist (not shown) using conventional lithography techniques or other suitable methods known in the art.

In the illustrative embodiment, wide field oxide areas 12 are patterned, as well as narrow field oxide regions 11. Narrow isolation regions refer to areas having less than 0.5 μm in diameter; and wide areas refer to regions which are greater than 0.5 μm in diameter. The wide field oxide areas 12 and narrow field oxide regions 11 are those portions of the substrate 1 on which is to be grown a thick field oxide.

Field oxide is a dielectric and functions to electrically isolate the active areas from each other. The narrow field oxide regions 11 are commonly seen in memory arrays where high density arrangement is required. The wide field oxide areas 12 are used in peripheral circuits where die real estate constraints are more relaxed.

In the preferred embodiment, an etch step is then performed in which the unpatterned areas of the stack 10 are etched back to the pad oxide layer 2.

The etch is preferably an anisotropic etch which results in side walls which are substantially normal to the substrate surface 1. Preferably the etch is performed using a $Cl_2$-based chemistry in a reactive ion etcher (R.I.E.). However, other etch chemistries, such as $CHF_3$, may also be used.

The etch removes all the unpatterned layers of the stack 10 down to the substrate 1, as shown in FIG. 1. A portion of the substrate 1 is then dry etched using a silicon etch chemistry, such as, for example, HBr or $NF_3$, thereby creating a recess in the substrate 1. The substrate 1 is recessed about 200Å to 3000 Å.

Figure 2:
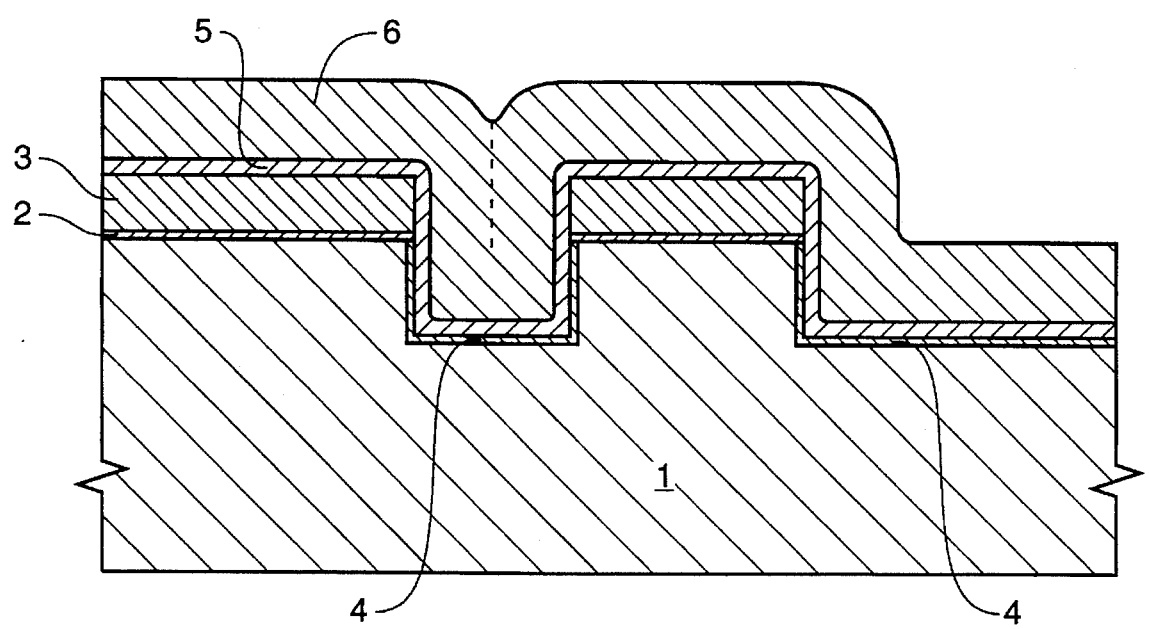
FIG. 2 is a schematic cross-section of the recessed trench of FIG. 1, after the trench re-oxidation, nitride deposition, and deposition of a conformal film, according to the process of the present invention.

An oxidation step is performed whereby another thin oxide layer 4 is preferably grown on the bottom and side wall portions of the trench or recess. The oxide layer 4 is about 20 Å–500Å, as shown in FIG. 2. In an alternative embodiment, the oxide layer 4 is deposited. The oxide layer 4 forms on the substrate 1 wherever the substrate 1 is exposed. Hence, the oxide layer 4 lines the recessed trench portions of the substrate 1 in the wide field oxide areas 12 and the narrow field oxide regions 11.

A thin "barrier" layer of, preferably, nitride 5 having an approximate thickness of 20 Å–500Å is then deposited. The thin nitride layer 5 is conformal in nature, and blankets the isolation stack 10, and also lines the trench portions of the wide field oxide areas 12 and the narrow field oxide regions 11. In the process of the present invention, the "barrier" layer serves to inhibit or delay oxidation of the material on which it is disposed. Nitride is preferred because nitride is a "barrier" to oxidation.

Next, a sacrificial film layer 6 of doped or undoped amorphous silicon, polysilicon, CVD oxide, or a silicon-rich oxide is conformally deposited. The film layer 6 is thick enough to "bridge" the narrow field oxide regions 11, thereby filling the trench portion of the narrow field oxide region 11. In other words, as the layer 6 conforms to the trench, the layer 6 forms a "bridge" as the film 6 impinges on itself, see dotted lines in FIG. 2. However, the wide field oxide area 12 is only blanketed with film material 6. Hence, the narrow field oxide regions 11 are filled to a higher level than the wide field oxide areas 12.

Figure 3:
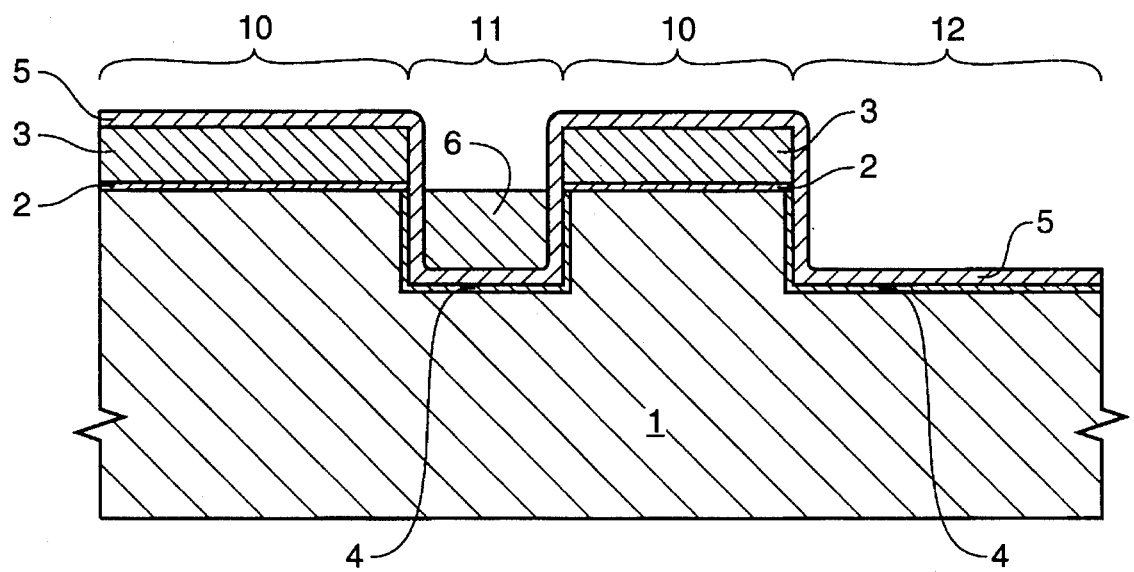
FIG. 3 is a schematic cross-section of the recessed trench of FIG. 2, after an isotropic etch, according to the process of the present invention.

An isotropic etch is then used to recess the sacrificial film layer 6 in the narrow field oxide regions 11. This etch also removes from the wide field areas 12 essentially all of the sacrificial film 6, or all of the film if possible. An isotropic etch has a vertical component and a horizontal component. Since layer 6 is at a higher level in the narrow field oxide regions 11 than in the wide field oxide areas 12, the layer 6 in the wide field oxide areas 12 is removed while the narrow field oxide regions 11 still contain some sacrificial film 6. This is illustrated in FIG. 3.

Figure 4:
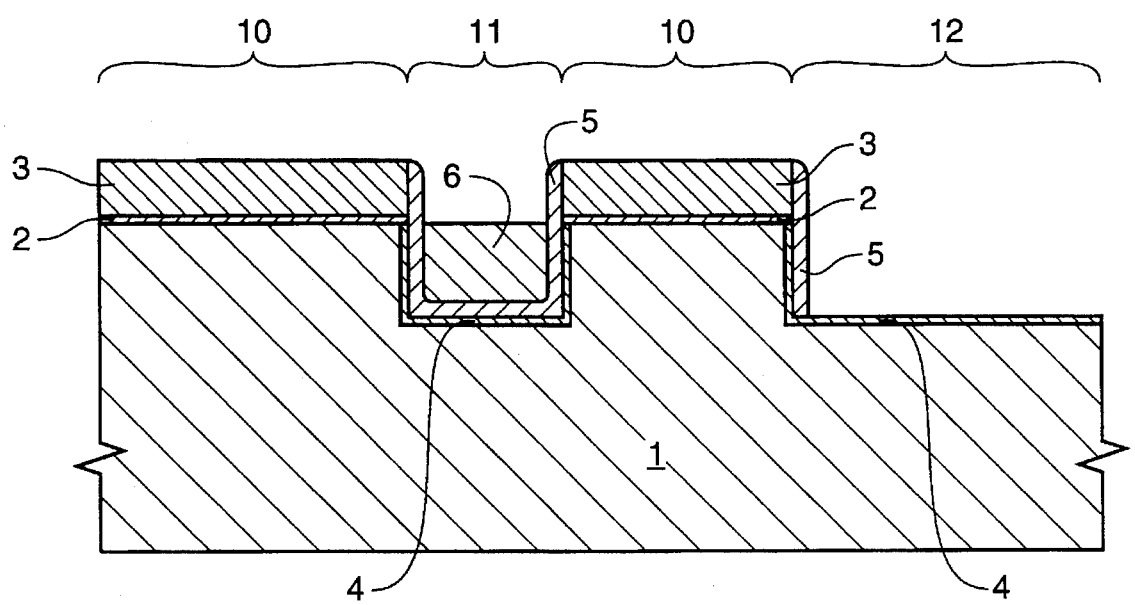
FIG. 4 is a schematic cross-section of the recessed trench of FIG. 3, after an anisotropic etch, according to the process of the present invention.
Figure 5:
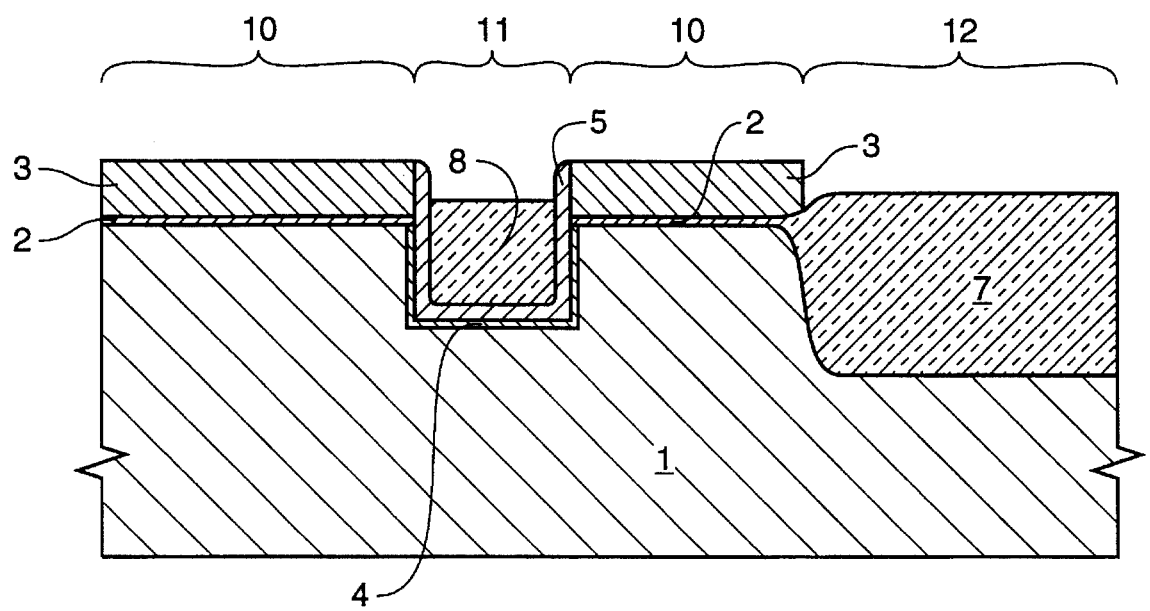
FIG. 5 is a schematic cross-section of the recessed trench of FIG. 4, after field oxidation, according to the process of the present invention.

At the end of the isotropic etch, a selective nitride etch is used to clear the thin nitride 5 from the wide field oxide areas 12. Since the sacrificial film 6 is still in the narrow field oxide regions 11, the thin nitride layer 5 remains substantially untouched in the narrow field oxide regions 11. FIG. 4 depicts the isolation scheme after the thin nitride layer 5 has been removed from the wide field oxide areas 12, as well as from the top of the isolation stacks 10.

Subsequent to the selective nitride etch, the wafer is ready for thermal field oxide 7, 8 growth in areas 12 and regions 11, respectively. An oxide layer 7, 8 (also known as field oxide) is formed over the exposed portions of the substrate 1, for example, by oxidizing the exposed substrate 1. An oxide layer 7, 8 having a thickness of about 1000Å to 6000Å is sufficient, although other thicknesses also function adequately. The structure following a field oxidation step, which results in an oxide layer 7, 8 having a preferred thickness in the approximate range of 4000 Å. The oxidation is preferably carried out in a steam ambient.

The amount of field oxide 8 that is grown in the narrow field oxide region 11 is limited to the amount of the sacrificial film 6 that is left within the trench of the region 11 after the selective nitride etch. The amount of sacrificial film 6 in the trench of the narrow field oxide region 11 is limited, and this film 6 is contained by the thin nitride 5, which layer 5 acts as an oxidation barrier. Hence, once the sacrificial film 6 is oxidized, the process necessarily stops. It is, therefore, a self-limiting process.

Since the wide field oxide areas 12 provide an exposed silicon substrate 1, the field oxidation target thickness and the amount of the sacrificial film 6 left in the narrow field regions 11 can be optimized to leave little or no topography after the field oxidation step. In other words, the oxidation process continues in the wide field oxide areas 12, but since there is no more silicon being sourced in the narrow field oxide areas 11, no more oxide 8 is grown. Hence, it is a self-limiting process.

After the oxidation step, it is necessary to sequentially remove any oxide which may have grown on the nitride layer, and the nitride layer 3. This strip can be done in a dry plasma environment or by use of sequential wet chemical etchants.

The pad oxide 2 can then be removed, in HF for about 45 seconds, thereby exposing the isolated active area. Alternatively, the pad oxide layer 2 may be left on the substrate 1.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that although the invention was described with reference to a LOCOS stack, it is also applicable to other LOCOS-type isolation schemes. Poly-buffered LOCOS stacks and ONO PBL stacks are examples of the types of isolation schemes to which the present invention is applicable without undue experimentation.

What is claimed is:

1. A method for forming an isolation device comprising the following steps:

providing a semiconductor substrate having a surface;

patterning said substrate to expose wide areas and narrow regions of said substrate surface, said narrow regions having a width less than 0.5 μm;

removing said exposed substrate to a level below said surface of said substrate;

oxidizing said exposed substrate, thereby forming a thin oxide layer on said exposed wide areas and narrow regions of said substrate;

forming a conformal film;

removing essentially all of said conformal film from said wide areas and leaving a portion of said conformal film in said narrow regions; and oxidizing said wide areas of said substrate and said portion of said conformal film.

2. The method according to claim 1, wherein said conformal film comprises at least one of polysilicon, amorphous silicon, CVD oxide, and silicon-rich oxide.

3. The method according to claim 2, wherein said removal of said conformal film comprises isotropically etching said conformal film.

4. The method according to claim 3, further comprising the step of:

depositing an oxidation barrier subjacent said conformal film, said oxidation barrier layer comprising a thin nitride film.

5. The method according to claim 1, further comprising forming a pad oxide layer and a nitride layer prior to forming said conformal film.

6. The method according to claim 5, further comprising the following step of:

removing said pad oxide layer and said nitride layer.

7. A process for isolating active areas of a semiconductor device, comprising the following steps:

creating wide and narrow isolation trenches in a substrate, said isolation trenches being lined with an oxidation barrier and filled with a conformal film, said conformal film impinging on itself in said narrow trench, said conformal film forming a step in said wide trench;

isotropically etching said conformal film, a portion of said conformal film remaining in said narrow trench, essentially all of said conformal film being removed from said wide trench; and oxidizing said portion of said conformal film remaining in said narrow trench.

8. The process according to claim 7, wherein said narrow trench has a width less than 0.5 μm.

9. The process according to claim 8, wherein isolation stacks are disposed on said substrate.

10. The process according to claim 9, wherein said oxidation in said narrow trench is self-limiting.

11. The process according to claim 10, wherein said conformal film comprises at least one of polysilicon, amorphous silicon, oxide, and silicon-rich oxide.

12. The process according to claim 11, wherein said conformal film is deposited in said trenches, said trenches having a depth in the approximate range of 200 Å–3000 Å.

13. The process according to claim 12, wherein an oxide layer is disposed subjacent said oxidation barrier.

14. A process for fabricating a recessed field oxide area, comprising the following steps:

providing a substrate having isolation stacks and recesses, said recesses being wide and narrow, said recesses having openings, said recesses having a depth in the approximate range of 200 Å–3000 Å;

lining said recesses with nitride;

blanketing said substrate with a conformal material, said conformal material bridging said openings of said narrow recesses;

removing said conformal material and said nitride from horizontal surfaces of said isolation stacks and said wide recesses; and oxidizing said substrate and said conformal material, thereby creating field oxide regions at said wide and narrow recesses.

15. The process according to claim 14, wherein said conformal material comprises at least one of doped silicon and undoped silicon.

16. The process according to claim 14, wherein said conformal material comprises oxide.

17. The process according to claim 14, wherein said conformal material comprises polysilicon.

18. The process according to claim 14, wherein said conformal film is removed by isotropic etching.

19. The process according to claim 18, wherein said isolation stack comprises pad oxide and nitride.

20. The process according to claim 19, wherein said isolation stack further comprises polysilicon.

21. The process of claim 1 wherein all of said conformal film is removed from said wide areas.

22. The process of claim 7 wherein all of said conformal film is removed from said wide trench.

23. The process of claim 14, further comprising creating nitride spacers during said nitride removal step.

24. The process of claim 14 wherein all of said conformal material is removed from said wide recesses.

* * * * *